(12) United States Patent
Elers

(10) Patent No.: US 7,611,751 B2
(45) Date of Patent: *Nov. 3, 2009

(54) VAPOR DEPOSITION OF METAL CARBIDE FILMS

(75) Inventor: Kai-Erik Elers, Vantaa (FI)

(73) Assignee: ASM America, Inc., Phoenix, AZ (US)

( * ) Notice: Subject to any disclaimer, the term of this patent is extended or adjusted under 35 U.S.C. 154(b) by 158 days.

This patent is subject to a terminal disclaimer.

(21) Appl. No.: 11/591,845

(22) Filed: Nov. 1, 2006

(65) Prior Publication Data

US 2008/0102204 A1    May 1, 2008

(51) Int. Cl.
*C23C 16/00* (2006.01)

(52) U.S. Cl. .................................. 427/249.1; 427/569

(58) Field of Classification Search .................. 427/569, 427/249.1
See application file for complete search history.

(56) References Cited

U.S. PATENT DOCUMENTS

| | | |
|---|---|---|
| 3,708,728 A | 1/1973 | Sterling et al. |
| 4,058,430 A | 11/1977 | Suntola et al. |
| 4,085,430 A | 4/1978 | Gerkema et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi et al. |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,356,673 A | 10/1994 | Schmitt et al. |
| 5,438,028 A | 8/1995 | Weissman et al. |
| 5,443,647 A | 8/1995 | Aucoin et al. |

(Continued)

FOREIGN PATENT DOCUMENTS

EP    0394054    4/1989

(Continued)

OTHER PUBLICATIONS

International Search Report and Written Opinion dated Apr. 7, 2008, Application No. PCT/US2007/082131.

(Continued)

*Primary Examiner*—Roberts Culbert
(74) *Attorney, Agent, or Firm*—Knobbe, Martens, Olson & Bear, LLP

(57) ABSTRACT

Methods of forming metal carbide thin films are provided. According to preferred embodiments, metal carbide thin films are formed in an atomic layer deposition (ALD) process by alternately and sequentially contacting a substrate in a reaction space with spatially and temporally separated vapor phase pulses of a metal source chemical, a reducing agent and a carbon source chemical. The reducing agent is preferably selected from the group consisting of excited species of hydrogen and silicon-containing compounds.

65 Claims, 3 Drawing Sheets

U.S. PATENT DOCUMENTS

| | | | |
|---|---|---|---|
| 5,595,784 A | 1/1997 | Kaim et al. | |
| 5,603,771 A | 2/1997 | Seiberras et al. | |
| 5,618,395 A | 4/1997 | Gartner | |
| 5,691,235 A | 11/1997 | Meikle et al. | |
| 5,693,139 A | 12/1997 | Nishizawa et al. | |
| 5,711,811 A | 1/1998 | Suntola et al. | |
| 5,723,384 A | 3/1998 | Park et al. | |
| 5,744,254 A | 4/1998 | Kampe et al. | |
| 5,769,950 A | 6/1998 | Takasu et al. | |
| 5,789,024 A | 8/1998 | Levy et al. | |
| 5,855,680 A | 1/1999 | Soininen et al. | |
| 5,916,365 A | 6/1999 | Sherman | |
| 5,946,598 A | 8/1999 | Yeh | |
| 5,961,365 A | 10/1999 | Lambert | |
| 5,964,943 A | 10/1999 | Stein et al. | |
| 5,965,004 A | 10/1999 | Cowley et al. | |
| 5,972,430 A | 10/1999 | DiMeo et al. | |
| 5,973,400 A | 10/1999 | Murakami et al. | |
| 6,006,763 A | 12/1999 | Mori et al. | |
| 6,015,590 A | 1/2000 | Suntola et al. | |
| 6,087,257 A | 7/2000 | Park et al. | |
| 6,099,904 A | 8/2000 | Mak et al. | |
| 6,104,074 A | 8/2000 | Chen | |
| 6,113,977 A | 9/2000 | Soininen et al. | |
| 6,139,700 A | 10/2000 | Kang et al. | |
| 6,156,382 A | 12/2000 | Rajagopalan et al. | |
| 6,162,501 A | 12/2000 | Kim | |
| 6,188,134 B1 | 2/2001 | Stumborg et al. | |
| 6,200,389 B1 | 3/2001 | Miller et al. | |
| 6,200,893 B1 | 3/2001 | Sneh | |
| 6,203,613 B1 | 3/2001 | Gates et al. | |
| 6,206,967 B1 | 3/2001 | Mak et al. | |
| 6,234,646 B1 | 5/2001 | Ito | |
| 6,270,572 B1 | 8/2001 | Kim et al. | |
| 6,284,646 B1 | 9/2001 | Leem | |
| 6,287,965 B1 | 9/2001 | Kang et al. | |
| 6,342,277 B1 | 1/2002 | Sherman | |
| 6,355,561 B1 | 3/2002 | Sandhu et al. | |
| 6,380,627 B1 | 4/2002 | Weihs et al. | |
| 6,416,577 B1 | 7/2002 | Suntoloa et al. | |
| 6,475,276 B1 * | 11/2002 | Elers et al. | 117/84 |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,511,539 B1 | 1/2003 | Raaijmakers | |
| 6,534,395 B2 | 3/2003 | Werkhoven et al. | |
| 6,576,053 B1 | 6/2003 | Kim et al. | |
| 6,599,572 B2 | 7/2003 | Saanila et al. | |
| 6,616,982 B2 | 9/2003 | Merrill et al. | |
| 6,652,924 B2 | 11/2003 | Sherman | |
| 6,706,115 B2 | 3/2004 | Leskela et al. | |
| 6,727,169 B1 | 4/2004 | Soininen et al. | |
| 6,794,287 B2 | 9/2004 | Saanila et al. | |
| 6,797,340 B2 | 9/2004 | Fang et al. | |
| 6,800,383 B1 | 10/2004 | Lakhotkin et al. | |
| 6,800,552 B2 | 10/2004 | Elers et al. | |
| 6,809,026 B2 | 10/2004 | Yoon et al. | |
| 6,821,889 B2 | 11/2004 | Elers et al. | |
| 6,827,978 B2 | 12/2004 | Yoon et al. | |
| 6,833,161 B2 | 12/2004 | Wang et al. | |
| 6,863,727 B1 | 3/2005 | Elers | |
| 6,902,763 B1 | 6/2005 | Elers et al. | |
| 6,986,914 B2 | 1/2006 | Elers et al. | |
| 7,045,406 B2 | 5/2006 | Huotari et al. | |
| 7,138,336 B2 | 11/2006 | Lee et al. | |
| 7,211,144 B2 | 5/2007 | Lu et al. | |
| 7,211,508 B2 | 5/2007 | Chung et al. | |
| 7,268,078 B2 | 9/2007 | Iyer | |
| 7,405,158 B2 | 7/2008 | Lai et al. | |
| 7,416,981 B2 | 8/2008 | Lee et al. | |
| 2001/0041250 A1 | 11/2001 | Werkhoven et al. | |
| 2002/0004293 A1 | 1/2002 | Soininen et al. | |
| 2002/0104481 A1 | 8/2002 | Chiang et al. | |
| 2002/0182320 A1 | 12/2002 | Leskela et al. | |
| 2003/0049931 A1 | 3/2003 | Byun et al. | |
| 2003/0082296 A1 | 5/2003 | Elers et al. | |
| 2003/0123216 A1 | 7/2003 | Yoon et al. | |
| 2003/0157760 A1 | 8/2003 | Xi et al. | |
| 2003/0194825 A1 | 10/2003 | Law et al. | |
| 2003/0203616 A1 | 10/2003 | Chung et al. | |
| 2004/0130029 A1 | 7/2004 | Raaijmakers et al. | |
| 2004/0206008 A1 | 10/2004 | Sung | |
| 2004/0208994 A1 | 10/2004 | Harkonen et al. | |
| 2004/0224504 A1 | 11/2004 | Gadgil | |
| 2004/0231799 A1 | 11/2004 | Lee et al. | |
| 2005/0037557 A1 | 2/2005 | Doczy et al. | |
| 2005/0106877 A1 | 5/2005 | Elers et al. | |
| 2006/0019494 A1 | 1/2006 | Cao et al. | |
| 2006/0079090 A1 | 4/2006 | Elers et al. | |
| 2006/0165892 A1 | 7/2006 | Weidman | |
| 2006/0211224 A1 | 9/2006 | Matsuda et al. | |
| 2006/0223300 A1 | 10/2006 | Simka et al. | |
| 2006/0240187 A1 | 10/2006 | Weidman | |
| 2006/0251812 A1 | 11/2006 | Kang et al. | |
| 2007/0148350 A1 | 6/2007 | Rahtu et al. | |
| 2008/0113110 A1 | 5/2008 | Elers et al. | |
| 2008/0182411 A1 | 7/2008 | Elers | |
| 2008/0274617 A1 | 11/2008 | Milligan | |

FOREIGN PATENT DOCUMENTS

| | | |
|---|---|---|
| EP | 0387403 | 10/1989 |
| EP | 0442490 | 8/1991 |
| EP | 0528779 A1 | 2/1993 |
| EP | 0528779 B1 | 2/1993 |
| EP | 0573033 | 6/1993 |
| EP | 0526779 | 10/1995 |
| EP | 0774533 | 10/1996 |
| EP | 0899779 | 3/1999 |
| EP | 1158070 | 11/2001 |
| EP | 1167567 | 1/2002 |
| JP | 6037041 | 2/1994 |
| JP | 6069157 | 3/1994 |
| JP | 7230957 | 8/1995 |
| JP | 8264530 | 10/1996 |
| JP | 09/087857 | 3/1997 |
| KR | 2001-88044 | 12/2001 |
| KR | 2002-31160 | 6/2002 |
| KR | 2002-87192 | 12/2002 |
| KR | 2003-5727 | 1/2003 |
| KR | 2003-14115 | 3/2003 |
| KR | 2003-14117 | 3/2003 |
| KR | 2003-33234 | 5/2003 |
| KR | 2003-40758 | 6/2003 |
| WO | WO 96/017107 | 6/1996 |
| WO | WO 96/18756 | 6/1996 |
| WO | WO 96/171707 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/47796 | 8/2000 |
| WO | WO 00/54320 | 9/2000 |
| WO | WO 00/63957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/66832 | 9/2001 |
| WO | WO 01/78213 | 10/2001 |
| WO | WO 01/88972 | 11/2001 |
| WO | WO 2004/077515 | 9/2004 |
| WO | WO 2004/077515 A | 9/2004 |

| | | | |
|---|---|---|---|
| WO | WO 2006/080782 A | 8/2006 | |
| WO | WO 2008/137399 | 11/2008 | |

OTHER PUBLICATIONS

1988RD-0296076 (Nov. 20, 1998) "Field effect transistor structure with improved transconductance—contg. spacer-less conducting gate oxide, and tungsten deposited on source and drain," Sep. 19, 2005, East Version 2.0.1.4. Patent-Assignee: Anonymous[ANON].
U.S. Appl. No. 11/743,574, filed May 2, 2007; Office Action mailed Feb. 5, 2009.
U.S. Appl. No. 11/588,837, filed Oct. 27, 2006; Office Action mailed Apr. 2, 2009.
U.S. Appl. No. 11/627,749, filed Nov. 27, 2007; Office Actions mailed May 2, 2007 and Nov. 13, 2007.
U.S. Appl. No. 10/242,368, filed Sep. 12, 2002; Office Actions mailed Apr. 27, 2004, Oct. 20, 2004, and Nov. 29, 2005; Notice of Allowance mailed Jul. 14, 2005.
U.S. Appl. No. 10/100,500, filed May 15, 2002; Office Action mailed Mar. 28, 2003; Notice of Allowance mailed Aug. 11, 2003.
U.S. Appl. No. 10/110,730, filed Apr. 11, 2002; Office Actions mailed Jan. 14, 2004 and Dec. 22, 2004; Notice of Allowance mailed Jul. 6, 2004.
U.S. File History printed Jun. 18, 2009 for U.S. Appl. No. 11/873,250, filed Oct. 16, 2007, entitled "Plasma-Enhanced Deposition of Metal Carbide Films".
U.S. File History printed Jun. 18, 2009 for U.S. Appl. No. 11/743,574, filed May 02, 2007, entitled "Periodic Plasma Annealing in an ALD-Type Process".
U.S. File History printed Jun. 18, 2009 for U.S. Appl. No. 11/588,837, filed Oct. 27, 2006, entitled "Enhanced Thin Film Deposition".
International Preliminary Examination Report mailed May 7, 2009 and International Search Report mailed Jan. 31, 2008 for Application No. PCT/US2007/081960.
International Search Report mailed Sep. 17, 2008 for Application No. PCT/US2008/061845.
1988RD-0296076 (November 20, 1998), Field effect transistor structure with improved transconductant—contg. spacer-less conducting gate oxide, and tungsten deposited on source and drain, East Version 2.0.1.4 Patent-Assignee: Anonymous[ANON], Sep. 19, 2005.
Andricacos et al., Damascene copper electroplating for chip, IBM Jour. Research and Dev., 1998, vol. 42, Issue 5, pp. 567-574.
Bain et al., Deposition of tungsten by plasma enhanced chemical vapour deposition, J. Phys. IV France, 1999, vol. 9, pp. 827-833.
Chang et al., Chemical Vapor Deposition of Tantalum Carbide and Carbonitride Thin Films from $Me_3CE=Ta(CH_2CMe_3)_3$ (E = CH, N), J. Mater. Chem., 2003, vol. 13, pp. 365-369.
Elers et al., NbC15 as a precursor in atomic layer epitaxy, Applied Surface Science, Jul. 09, 1994, vol. 82/83, pp. 468-474.
Favis et al., Atomic layer epitaxy of silicon, silicon/germanium and silicon carbide via extraction/exchange processes, Avail. NTIS. Report, 1991, pp. 33.
Fuyuki et al., Atomic layer epitaxy controlled by surface superstructures in silicon carbide, Thin Solid Films, 1993, vol. 225, Issue 1-2, pp. 225-229.
Fuyuki et al., Atomic layer epitaxy of cubic silicon carbide by gas source MBE using surface superstructure, J. Cryst. Growth, 1989, vol. 95, Issue 1-4, pp. 461-463.
Girolami et al., Tailored Organometallics as Low-Temperature CVD Precursors to Thin Films, Materials Research Society Symposium Proceedings, 1988, vol. 121, pp. 429-438.
Hara et al., Atomic layer control of .beta.-silicon carbide (001) surface, Springer Proc. Phys., 1992, pp. 90-95.
Hiltunen et al., Nitrides of titanium, niobium, tantalum and molybdenum grown as thin films by the atomic layer epitaxy method, Thin Solid Films, 1988, vol. 166, pp. 149-154.
Jehn et al., Gmelin Handbook of Inorganic and Organometallic Chemistry, 8th Edition, 1993, vol. A 5b, Issue 54, pp. 131-154.
Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.

Juppo et al., Deposition of copper films by an alternate supply of CuCl and Zn, J. Vac. Sci. Technol A, Jul./Aug. 1997, vol. 15, Issue 4, pp. 2330-2333.
Kim et al., Atomic-layer-depositied WNxCy thin films as diffusion barrier for copper metallization, Applied Physics Letters, Jun. 23, 2003, vol. 82, Issue 25, pp. 4486-4488.
Kirk-Othmer, Encyclopedia of Chemical Technology, John Wiley & Sons, Inc., 1992, vol. 4, pp. 841-878.
Klaus et al., Atomic Layer Deposition of Tungsten Nitride Films Using Sequential Surface Reactions, Journal of the Electrochemical Society, 2000, vol. 147, Issue 3, pp. 1175-1181.
Klaus et al., Atomic layer deposition of tungsten using sequential surface chemistry with a sacrificial stripping reaction, Thin Solid Films, 2000, vol. 360, pp. 145-153.
Klaus et al., Atomic layer deposition of tungsten and tungsten nitride using sequential surface reactions, AVS $46^{th}$ International Symposium, 1999, Seattle, WA, US.
Klaus et al., Atomically controlled growth of tungsten and tungsten nitride using sequential surface reactions, Applied Surface Science, 2000, vol. 162-163, pp. 479-491.
Lai et al., Precursors for Organometallic Chemical Vapor Deposition of Tungsten Carbide Films, Chem. Mater., 1995, vol. 7, pp. 2284-2292.
Leskelä et al., ALD precursor chemistry: Evolution and future challenges, Jour. Phys. IV France 9, 1999, pp. 837-852.
Ludviksson et al., Low-Temperature Thermal CVD of Ti-Al Metal Films Using a Strong Reducing Agent, Chem. Vap. Deposition, 1998, vol. 4, Issue 4, pp. 129-132.
Martensson, Use of atomic layer epitaxy for fabrication of Si/TiN/Cu structures, J.Vac. Sci. Technol. B, Sep./Oct. 1999, vol. 17, Issue 5, pp. 2122-2128.
Martensson et al., Atomic Layer Epitaxy of Copper and Tantalum, Chemical Vapor Deposition, 1997, vol. 3, Issue 1, pp. 45-50.
Martensson et al., $Cu(THD)_2$ As Copper Source in Atomic Layer Epitaxy, Electrochemical Society Proceedings, vol. 97-25, pp. 1529-1536.
Matsunami et al., Hetero-interface control and atomic layer epitaxy of SiC, Applied Surface Science, 1997, vol. 112, pp. 171-175.
Min et al., Atomic Layer Deposition of TiN Films by Alternate Supply of Tetrakis (ethylmethylamino)-Titanium and Ammonia, Jpn. J. Appl. Phys., 1998, vol. 37, pp. 4999-5004.
Min et al., Atomic Layer Deposition of TiN Thin Films by Sequential Introduction of Ti Precursor and $HN_3$, Mat. Res. Soc. Symp. Proc., 1998, vol. 514, pp. 337-342.
Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.
Polyakov et al., Growth of GaBN Ternary Soloutions by Organometallic Vapor Phase Epitaxy, Journal of Electronic Materials, 1997, vol. 26, Issue 3, pp. 237-242.
Ritala et al., Atomic layer epitaxy growth of TiN thin films, J. Electrochem. Soc., 1995, vol. 142, Issue 8, pp. 2731-2737.
Ritala et al., Effects of intermediate zinc pulses on properties of Tin and NbN films deposited by atomic layer epitaxy, Appl. Surf. Sci., 1997, vol. 120, pp. 199-212.
Ritala et al., Perfectly conformal Tin and Al2O3 films deposited by atomic layer deposition, Chem. Vapor Deposition, 1999, vol. 5, pp. 7-9.
Ritala et al., Atomic Layer Epitaxy Growth of TiN Thin Films from $TiI_4$ and $NH_3$, J. Electrochem. Soc., Aug. 1998, vol. 145, Issue 8, pp. 2914-2920.
Sadayuki et al., Sub-atomic layer growth of SiC at low temperatures, Japanese Journal of Applied Physics, 1995, vol. 34, Issue 11, pp. 6166-6170.
Sherman et al., Plasma enhanced atomic layer deposition of Ta for diffusion barrier applications, AVS $46^{th}$ International Symposium, Oct. 26, 1999, Seattle, WA, US.
Suntola, Atomic Layer Epitaxy, Handbook of Crystal Growth 3, 1994, pp. 601-663.
The British Library, Kirk-Othmer Encyclopedia of Chemical Technology, John Wiley & Sons, Inc., 1992, vol. 4, pp. 841-878.

Tulhoff et al., Ullmann's Encyclopedia of Industrial Chemistry, 5$^{th}$, Completely Revised Edition, 1986, vol. A5, pp. 61-77.

Utriainen et al., Controlled Electrical Conductivity in SnO$_2$ Thin Films by Oxygen or Hydrocarbon Assisted Atomic Layer Epitaxy, J. Electrochem. Soc., 1999, vol. 146, Issue 1, pp. 189-193.

Wong et al., Barriers for copper interconnections, Solid State Technology, 1999, pp. 1-7.

Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.

\* cited by examiner

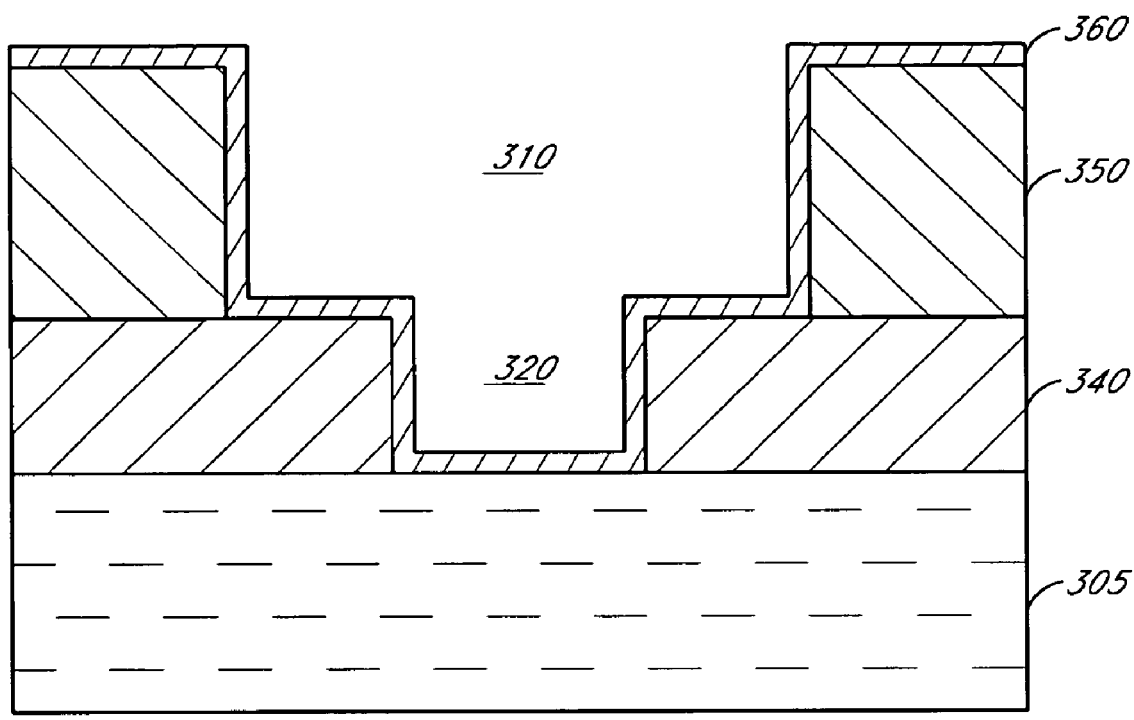
FIG. 3

VAPOR DEPOSITION OF METAL CARBIDE FILMS

BACKGROUND OF THE INVENTION

1. Field of the Invention

The present invention relates generally to the field of semiconductor manufacturing and, in particular, to forming metal carbide thin films using atomic layer deposition (ALD).

2. Description of the Related Art

The integration level of components in integrated circuits is increasing, producing a need for smaller components, including interconnects. Design rules are dictating a feature size less than or equal to 0.2. µm. This makes film coverage in deep vias important but difficult to obtain.

The trend of decreasing feature size is evident, for example, in memory circuits or devices such as dynamic random access memories (DRAMs), flash memory, static random access memories (SRAMs), ferroelectric (FE) memories, and integrated circuit components, such as gate electrodes and diffusion barriers in complementary metal oxide semiconductor (CMOS) devices.

Metal carbides have found widespread use in the electronics industry, from gate electrodes to diffusion barriers. For example, tantalum carbide (TaC) is a low resistivity metal that is commonly used as an n-type metal oxide semiconductor (NMOS) gate electrode. Further, TaC has been found to be effective at inhibiting electromigration of noble metal atoms at the interface between metal interconnects and metal lines. As another example, metal carbide films have been used as barrier layers in damascene and dual damascene structures.

Transition metal carbides typically include one or more metals of groups 4, 5, 6, 7, 8, 9, 10, or 11 of the periodic table. Transition metal carbides are generally relatively inert, have very high melting points, are extremely hard and wear resistant, and have high thermal conductivity and metal-like electrical conductivity. For these reasons, transition metal carbides have been proposed for use as low resistance diffusion barriers in semiconductor fabrication (see, e.g., international patent application WO 00/01006; U.S. Pat. No. 5,916,365).

Transition metal carbides can have a wide range of compositions. Ordered and disordered carbon deficient forms exist, of which the tungsten carbides, $WC_x$, are examples. In these forms, carbon resides in the interstitial cavities between metal atoms. General information about metal carbides can be found, for example, in Ullmann's Encyclopedia of Industrial Chemistry, $5^{th}$ Edition, Vol. A5, VCH Verlagsgesellschaft, 1986, pg. 61-77, and in the Kirk-Othmer Encyclopedia of Chemical Technology, $4^{th}$ Edition, Vol. 4, John Wiley & Sons, Inc., 1992, pg. 841-878.

Deposition methods available for forming metal carbide films or thin films include chemical vapor deposition (CVD), physical vapor deposition (PVD) and atomic layer deposition (ALD), which is sometimes called atomic layer epitaxy (ALE).

A CVD method of depositing tungsten carbide from tungsten hexafluoride, hydrogen and a carbon-containing gas has been described in, for example, international patent application WO 00/47796. The carbon-containing compound is initially thermally activated. All of the gaseous source chemicals are introduced into a reaction space at the same time, resulting in the deposition of nonvolatile tungsten carbide on the substrate. A CVD reaction of $WF_6$ with trimethylamine and $H_2$ has been shown to produce WC films at 700° C.-800° C. and beta-$WC_x$ films at 400° C.-600° C. (Nakajima et al., J. Electrochem. Soc. 144 (1997) 2096-2100). The $H_2$ flow rate affects the deposition rate of tungsten carbide. A problem with the disclosed process is that the substrate temperature is rather high relative to thermal budgets for state-of-the-art semiconductor fabrication, particularly in metallization stages.

PVD processes generally deposit along a line-of-sight. One method of depositing tantalum carbide for a diffusion barrier layer by PVD has been described in U.S. Pat. No. 5,973,400. A tantalum carbide layer was formed by sputtering tantalum or tantalum carbide under an $N_2/CH_4/Ar$ atmosphere. Line-of-sight deposition, however, means that complex substrate contours will have insufficient thin film coverage in shaded areas. Additionally, line-of-sight deposition means that low-volatility source material arriving directly from the source to the substrate will likely adhere to the first solid surface that it encounters, thus producing low-conformality coverage.

A "thermal" ALD method of forming metal carbide films, wherein the substrate is sequentially and alternately contacted with vapor phase pulses of two or more source chemicals, is described, for example, in U.S. Pat. No. 6,482,262. According to the methods described therein, a transition metal source chemical and carbon source gas are alternately and sequentially exposed to a substrate in a reaction space, which is maintained at an elevated temperature. The pulsing sequence is repeated to form a metal carbide (e.g., TaC) film of desired thickness. Due to the self-limiting nature of ALD, thin films are grown at about one monolayer (ML) increments. Thus, ALD has the potential for producing substantially uniform and highly conformal metal carbide films.

Problems with prior art methods of forming metal carbide films include difficulties in forming films with low impurity contents. Depending on the precursor used, metal carbon films may include high halogen, oxygen and/or carbon impurities, which significantly reduce film quality and device performance. Although ALD is capable of forming uniform metal carbide films on geometrically challenging structures, producing high quality (i.e. low impurity) films may be difficult to achieve with prior art methods.

Accordingly, there is a need for improved ALD methods of depositing metal carbide films with low impurity contents.

SUMMARY OF THE INVENTION

According to some embodiments of the invention, a reducing agent is utilized in ALD-type processes for depositing elemental metal films. These films are then exposed to a carbon source chemical to form metal carbide thin films. In a preferred embodiment, the reducing agent is selected from the group consisting of excited species of hydrogen ($H_2$) and silicon-containing compounds. The ALD-type processes typically comprise multiple deposition cycles, and the reducing agent may be provided in each deposition cycle of a particular ALD-type process or at intervals during the ALD-type process.

In some embodiments of the invention, atomic layer deposition (ALD) processes for growing a metal carbide film are disclosed. The processes comprise contacting a substrate in a reaction space with spatially and temporally separated vapor phase pulses of: a metal source chemical, a reducing agent and a carbon-containing compound.

In other embodiments of the invention, atomic layer deposition (ALD) processes for growing a metal carbide thin film are provided. The processes preferably comprise the sequential steps of: a) contacting a substrate in a reaction space with a vapor phase pulse of a metal source chemical; b) removing excess metal source chemical from the reaction space; c) contacting the substrate with a vapor phase pulse of a reducing agent; d) removing excess reducing agent from the reaction space; e) contacting the substrate with a vapor phase pulse of a carbon-containing compound; and f) removing any excess carbon-containing compound from the reaction space. Excess reactants and reaction byproducts can also be removed between the vapor phase pulses. In still other embodiments of the invention, plasma-enhanced atomic layer deposition (PEALD) processes for growing a metal carbide thin film are disclosed. The processes comprise alternately and sequentially contacting a substrate in a reaction space with spatially and temporally separated vapor phase pulses of a metal source material that forms no more than about one monolayer of a metal thin film on an exposed surface of the substrate; excited species of hydrogen ($H_2$) that reduce the metal thin film to an elemental metal thin film; and a carbon source material that reacts with the reduced thin film to form no more than about one monolayer of a metal carbide thin film, wherein excess metal source material, excited species of hydrogen and carbon source material are removed from the reaction space after each of the respective pulses.

All of these embodiments are intended to be within the scope of the invention herein disclosed. These and other embodiments of the present invention will become readily apparent to those skilled in the art from the following detailed description of the preferred embodiments having reference to the attached figure, the invention not being limited to any particular preferred embodiments disclosed.

BRIEF DESCRIPTION OF THE DRAWINGS

The invention will be better understood from the Detailed Description of the Preferred Embodiments and from the appended drawings, which are meant to illustrate and not to limit the invention, and wherein:

FIG. 3 is a schematic cross-sectional side view of a dual damascene structure comprising a metal carbide thin barrier layer formed over the trench and via.

DETAILED DESCRIPTION OF THE PREFERRED EMBODIMENT

Figure 1:
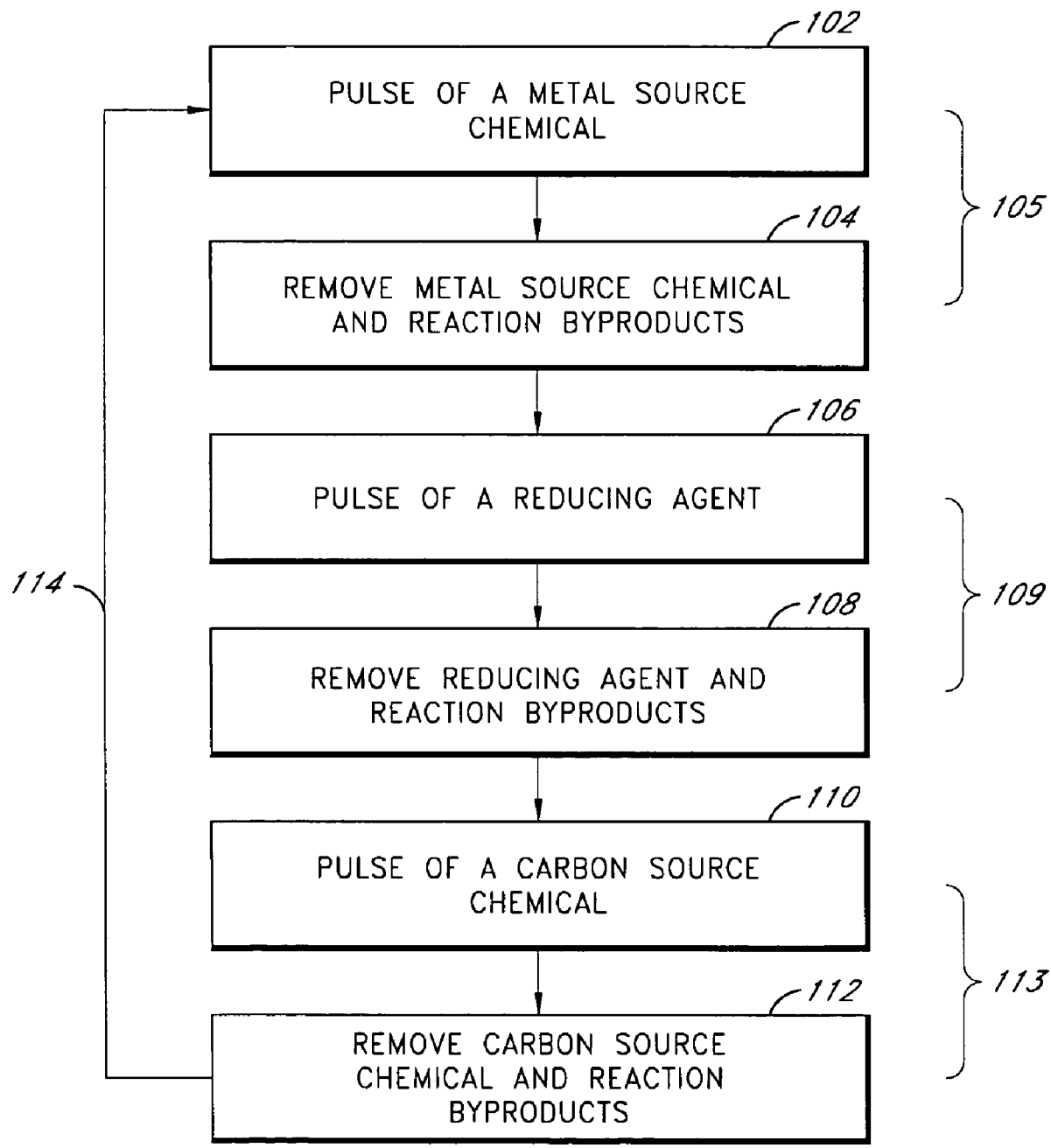
FIG. 1 is a flow chart generally illustrating a method of forming a binary compound by an atomic layer deposition (ALD) type process, in which the reducing agent is provided after the metal source chemical.

The ALD-type methods described herein advantageously enable formation of metal carbide thin films with low or reduced impurity levels compared to prior art methods, thereby improving film quality. In preferred embodiments, a deposition cycle of an ALD-type process preferably comprises exposing a substrate surface to a metal source chemical to form at most about one monolayer (ML) of a metal-containing thin film per cycle and exposing the metal-containing thin film to a reducing agent to reduce the thin film to an elemental metal thin film. The elemental metal thin film is subsequently contacted with a carbon source chemical, thereby forming a metal carbide film.

Metal carbide films formed according to methods of preferred embodiments preferably comprise one or more metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and aluminum (Al).

Definitions

In context of the present invention, an "ALD process" or an "ALD-type process" generally refers to a process for producing thin films over a substrate molecular layer by molecular layer using self-saturating and self-limiting chemical reactions. "ALD-type processes" include, without limitation, both thermal ALD and plasma-enhanced ALD (PEALD) processes. The general principles of ALD are disclosed, e.g., in U.S. Pat. Nos. 4,058,430 and 5,711,811, the disclosures of which are incorporated herein by reference. In an ALD process, gaseous reactants, also called precursors or, in some cases, source chemicals, are conducted into a reaction space in a reactor where they contact a substrate and react with the substrate surface in a self-limiting manner. The pressure and the temperature of the reaction chamber are adjusted to a range where physisorption (i.e. condensation of gases) and thermal decomposition of the precursors are avoided. Because of steric hindrance, only up to one monolayer (i.e. an atomic layer or a molecular layer) of material is deposited at a time during each pulsing cycle. Thus, the actual growth rate of the thin film, which is typically presented as Å/pulsing cycle, depends, for example, on the number of available reactive surface sites or active sites on the surface and bulkiness of the chemisorbing molecules. Gas phase reactions between precursors and any undesired reactions of byproducts are inhibited because precursor pulses are separated from each other by time and the reaction chamber is purged with an inactive or inert gas (e.g. nitrogen, argon or hydrogen) and/or evacuated using, e.g., a pumping system between precursor pulses to remove surplus gaseous reactants and reaction byproducts from the chamber.

"Reaction space" is used to designate a chamber or an arbitrarily defined volume therein in which conditions can be adjusted to effect thin film growth by ALD. Typically the reaction space includes surfaces subject to all reaction gas pulses from which gases or particles can flow to the substrate, by entrained flow or diffusion, during normal operation. The reaction space can be, for example, in a single-wafer ALD reactor or a batch ALD reactor, where deposition on multiple substrates takes place at the same time. As another example, the reaction space can be in a PEALD reactor. For example, the EmerALD™ reactor, available from ASM America, Inc., may be used.

"Adsorption" is used to designate a chemical attachment of atoms or molecules on a surface.

"Surface" is used to designate a boundary between the reaction space and a feature of a substrate.

"Thin film" means a film that is grown on a substrate from elements or compounds that are transported as separate ions, atoms or molecules from a source to the substrate. The thickness of the film depends upon the application and may vary in a wide range, preferably from one atomic layer to 1,000 nanometers (nm) or more. In some embodiments, the thin film has a thickness preferably less than about 20 nm, even more preferably less than about 10 nm and most preferably less than about 5 nm.

"Metal carbide film" and "metal carbide thin film" designate a thin film that comprises metal (or a plurality of metals) and carbon. Metal carbide films can be generally defined as $M_xC_y$, where 'M' is a metal or a plurality of metals, 'C' is carbon and 'x' and 'y' are numbers. Metal carbide films may be stoichiometric (i.e., x=y) or non-stoichiometric (i.e., x≠y).

Preferred ALD Methods

The methods presented herein allow controlled deposition of metal carbide thin films over substrate surfaces. In preferred embodiments, the metal carbide films are deposited using at least one halogen-containing reactant. In preferred embodiments, an atomic layer deposition (ALD) type process is used to form metal carbide thin films on substrates, such as integrated circuit workpieces. The surfaces on which the thin films are deposited can take a variety of forms. Examples include, but are not limited to, silicon, silicon oxide (SiO2), coated silicon, dielectric materials, low-k materials, metals such as copper and aluminum, metal alloys, metal oxides and various nitrides, such as transition metal nitrides and silicon nitride or a combination of said materials. Geometrically challenging applications are also possible due to the highly conformal deposition that can be achieved using the self-saturating surface reactions that characterize ALD.

In one embodiment, a substrate or workpiece is placed in a reaction space and metal carbide thin films are formed thereon by an ALD-type process comprising repetition of a self-limiting deposition cycle. Preferably, each deposition cycle comprises alternately and sequentially contacting a substrate with spatially and temporally separated vapor phase pulses of at least three different reactants or source chemicals in at least three distinct phases. In some embodiments, each deposition cycle comprises three distinct phases and is referred to herein as a "three step" or "three phase" method. A first reactant, which is a metal precursor, will chemisorb to form no more than about one monolayer over the substrate surface and includes a metal species desired in the thin film being deposited. That is, once all available binding sites are filled, no more precursor can chemically adsorb (chemisorb) onto or react with the substrate surface. A second reactant is a reducing agent that preferably reduces the metal (or metallic) thin film. The third reactant is a carbon-containing material that reacts with the metal thin film to form no more than about one monolayer of a metal carbide thin film over the substrate surface. Depending on the nature of the film being deposited, one or more reactants can be utilized, such as a second metal reactant.

The first reactant, also referred to herein as a "metal source chemical" or "metal source material," chemisorbs in a self-limiting manner. The second reactant may be a halide, and thus the deposited monolayer can be terminated with halogen ligands. The chemisorbed layer left by a pulse of the metal source chemical is self-terminated with a surface that is non-reactive with the remaining chemistry of that pulse. Metal halides include metal bromides, metal chlorides, metal fluorides and metal iodides. In preferred embodiments, the metal source chemical includes metal selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and aluminum (Al). As an example, the metal source chemical may include $TiCl_4$, $ZrCl_4$, $HfCl_4$, $VCl_4$, $NbCl_5$, $TaCl_5$, $TaF_5$, $CrCl_4$, $WCl_5$, $WCl_6$, $WF_6$, or $AlCl_3$. In other embodiments the metal source chemical is a metal organic compound and the deposited monolayer may contain carbon impurities. Metal organic compounds can be selected from the group consisting of metal dialkylamido compounds and metal cyclopentadienyl compounds.

The second reactant is preferably a reducing agent. The reducing agent is capable of reducing the metal (or plurality of metals) in the growing film to a lower oxidation state, preferably to an elemental metal state, more preferably to a substantially elemental metal state, thereby forming a reduced metal film. In preferred embodiments, the second reactant is able to remove halide and/or other impurities (e.g., carbon, oxygen) species from the growing film and/or the reaction space. The second reactant may be an excited species of hydrogen ($H_2$). Excited species of hydrogen may include, without limitation, hydrogen radicals (H*) and hydrogen ions ($H^+$). Excited species of hydrogen may be generated by, e.g., a plasma generator or a radical generator, either in situ or remote. In other embodiments, the second reactant may be a silicon-containing compound. Silicon-containing compounds may be selected, for example, from the group consisting of silane ($SiH_4$), disilane ($Si_2H_6$) and trisilane ($Si_3H_8$). The second reactant may also be a boron-containing compound. Boron-containing compounds may be selected, for example from the group consisting of borane ($BH_3$) and diborane ($B_2H_6$).

The reducing agent may be provided in each deposition cycle of the ALD process or at intervals during the deposition process. For example, the pulse of the reducing agent may precede the pulse of the metal source chemical. As another example, the reducing agent may be provided from every 1 to 25 deposition cycles. Preferably, the intervals in which the reducing agent is provided are selected to ensure compositional uniformity throughout the metal carbide thin films. The reducing agent reacts with and reduces the metal (or metallic) film formed in a subsequent step, thereby providing active sites for the carbon-containing compound. At the time the reducing agent is provided, the film grown in the most recent deposition cycle(s) is preferably thin enough such that the reducing agent can penetrate the film. In addition, if the reducing agent comprises radicals, such as hydrogen radicals, it is preferably provided initially at a point in the deposition process such that it is not able to penetrate the deposited film and damage the underlying substrate material.

A third reactant is preferably capable of contributing carbon to the reduced metal film. The third reactant is typically not a halide, although in some embodiments it may be. In a preferred embodiment, the third reactant is a hydrocarbon, more preferably a hydrocarbon selected from the group consisting of alkanes, alkenes, and alkynes. In some embodiments the third reactant is acetylene ($C_2H_2$). In other embodiments, the third reactant is a carbon-containing compound comprising boron, such as, e.g., triethyl boron (TEB). The third reactant is also referred to herein as a "carbon source material", a "carbon-containing compound", or a "carbon source chemical." Although referred to as the first, second and third reactants, these designations do not necessarily correspond to the order in which the reactants are provided in the ALD process.

In exemplary embodiments, a uniform metal carbide film is deposited according to a three phase ALD-type method. In a "first phase" of an ALD deposition cycle, a metal film is deposited over a substrate. In a "second phase" of the ALD deposition cycle, the metal film is reduced to an elemental metal film. In a "third phase" of the ALD deposition cycle, the metal film is exposed to a carbon source chemical to form a metal carbide film.

In the first phase (also referred to herein as a "metal phase"), a reactant or source chemical comprising a metal species is supplied to the reaction chamber and chemisorbs to the substrate surface. The reactant supplied in this phase is selected such that, under the preferred conditions, the amount of reactant that can be bound to the surface is determined by the number of available binding sites and by the physical size of the chemisorbed species (including ligands). The chemisorbed layer left by a pulse of the metal reactant is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting. Excess reactant and reactant byproducts (if any) are removed from the reaction space by, e.g., purging with an inert gas and/or evacuation.

Maximum step coverage on the workpiece surface is obtained when no more than about a single molecular layer (monolayer) of metal source chemical molecules is chemisorbed in each self-limiting pulse. Due to the size of the chemisorbed species and the number of reactive sites, somewhat less than a monolayer (ML) may be deposited in each pulse of metal reactant.

In some embodiments, prior to the first phase, the substrate surface is provided with an initial surface termination. This may entail providing a seed layer to enhance adsorption of the metal source chemical. In some cases, the seed layer enhances the probability in which a metal source chemical striking the surface chemisorbs onto the surface, which is commonly referred to as a sticking coefficient. As such, the seed layer may enhance the sticking coefficient of the metal source chemical, thus enhancing the efficiency in which the metal source chemical adsorbs onto the surface.

In the second phase, a pulse of a reducing agent is provided, reacting with molecules left on the substrate surface by the preceding pulse. In some embodiments, the reducing agent comprises excited species of hydrogen. In other embodiments, the reducing agent comprises a silicon-containing compound, such as, e.g., silane, disilane and trisilane. In still other embodiments, the reducing agent comprises a boron-containing compound such as, e.g., borane and diborane. The reducing agent preferably lowers the oxidation state of the metal deposited in the metal phase. This phase is also referred to herein as "the reduction phase."

Excess reducing agent and reaction byproducts, if any, are removed from the reaction space by purging and/or evacuation.

In the third phase, a carbon source chemical is provided. In preferred embodiments, the carbon source chemical reacts with the monolayer left by the reduction phase and contributes carbon atoms to the film. The carbon source chemical is preferably a hydrocarbon, more preferably a hydrocarbon selected from the group consisting of alkanes, alkenes and alkynes. The carbon source chemical may be acetylene ($C_2H_2$), for example.

In one embodiment, an ALD-type process comprises:
1. providing a metal halide to the reaction space;
2. removing any excess metal halide and reaction byproducts from the reaction space;
3. providing a reducing agent to the reaction space;
4. removing any excess reducing agent and reaction byproducts from the reaction space;
5. providing a carbon source chemical to the reaction space; and
6. removing any excess carbon source chemical and reaction byproducts from the reaction space.

Steps 1 and 2 correspond to the first phase, steps 3 and 4 correspond to the second phase, and steps 5 and 6 correspond to the third phase. Although referred to as the first phase, second phase and third phase, these designations do not necessarily refer to the order in which the phases are performed in the ALD process. The ALD process can preferably begin with any one of the three phases. For example, the ALD process can begin with the second phase, followed by the first phase and the third phase.

Removal of excess reactants (or source chemicals) and byproducts is preferably achieved with the aid of a purging gas (e.g., Ar, He). In some embodiments, a source chemical is pulsed with the aid of a carrier gas (e.g., $H_2$). In such a case, the carrier gas may serve as the purge gas and a reactant removal step entails stopping the flow of the source chemical and continuing to flow the carrier gas. As an alternative, removal of excess reactants and byproducts may entail evacuation with the aid of vacuum generated by a pumping system. Reactant removal may entail the combined use of a purging gas and a vacuum generated by a pumping system.

With reference to FIG. 1, in an exemplary embodiment of the three-phase (or three-step) process, after initial surface termination, if necessary, a metal source chemical pulse is supplied 102 to a substrate or workpiece in a reaction space. In accordance with a preferred embodiment, the metal source chemical pulse comprises a carrier gas flow (e.g., Ar or $H_2$) and a volatile halide species that is reactive with the substrate surfaces of interest and further comprises a metal species that is to form part of the deposited layer. Accordingly, a halogen-containing species adsorbs upon the workpiece surfaces. The metal source chemical pulse is self-saturating and results in halide tails terminating the monolayer, protecting the layer from further reaction with the metal source chemical, such that any excess constituents of the first reactant pulse do not further react with the initial chemisorbed monolayer. The metal source chemical thus leaves no more than about one monolayer of a metal on the workpiece surfaces.

Excess first metal reactant is then removed 104 from the reaction space. Preferably, step 104 merely entails stopping the flow of the first reactant while continuing to flow a carrier gas for a sufficient time to purge excess reactants and reactant byproducts from the reaction space. Preferably, greater than about two reaction chamber volumes of the purge gas are flowed through the chamber between reactant pulses, more preferably greater than about three chamber volumes. Preferably the removal 104 comprises continuing to flow purge gas for between about 0.1 seconds and 20 seconds after stopping the flow of the first reactant pulse. Inter-pulse purging is described, for example, in U.S. Pat. No. 6,511,539, filed Sep. 8, 1999, the disclosure of which is incorporated herein by reference. In other arrangements, the chamber may be pumped down between alternating chemistries. See, for example, PCT publication number WO 96/17107, published Jun. 6, 1996, the disclosure of which is incorporated herein by reference. Together, the adsorption 102 and reactant removal 104 represent a first phase 105 in an ALD cycle, which can be referred to as a metal phase.

With continued reference to FIG. 1, a reducing agent pulse is then supplied 106 to the workpiece. The reducing agent desirably reacts with or adsorbs upon the monolayer left by the metal source chemical to leave no more than about a monolayer of an elemental metal on the workpiece surfaces. The reducing agent preferably removes at least some halide species and/or other impurities (e.g., carbon, oxygen) from the metal film, thereby reducing the oxidation state of the metal in the metal film. This step preferably results in an elemental metal thin film over the substrate.

After a time period sufficient to completely saturate and react the monolayer with the reducing agent pulse 106, excess reducing agent and any reaction byproducts are removed 108 from the reaction space. As with the removal 104 of the first reactant, this step 108 preferably comprises stopping the flow of the reducing agent and continuing to flow carrier gas for a time period sufficient for excess reactants and volatile reaction byproducts from the reducing agent pulse to be purged from the reaction space. Together, the second reactant pulse 106 and removal 108 represent a second phase 109 in the illustrated process, and can also be considered a reduction phase.

When the excess reactants of the reducing agent pulse, if any, have been removed 108 from the chamber, a carbon source chemical pulse is supplied to the workpiece 110. Preferably, the carbon source chemical reacts with the metal film formed in the reduction phase to produce a metal carbide thin film. Temperature and pressure conditions are preferably arranged to facilitate this reaction and to avoid diffusion of the carbon source chemical through the monolayer to underlying materials.

After a time period sufficient to react the monolayer with the carbon source chemical, excess carbon source chemical and any volatile reaction byproducts are removed 112 from the reaction space, preferably with the aid of a purge gas. The removal can be as described for step 104. Together, the carbon source chemical pulse 110 and removal 112 represent a third phase 113 of the illustrated ALD process, which can be considered a carbon-contributing phase. Because this step increases the oxidation state of the metal deposited in the metal phase, this step can also be considered an oxidation phase.

After the removal step 112, the three-phase process can be repeated 114 to form a metal carbide film of the desired (or a predetermined) thickness. In some cases, forming a metal carbide film of several nanometers thickness requires repeating the three-step process multiple times. In some embodiments, the three-step process is repeated at least 10 times. In other embodiments, the three-step process is repeated at least 100 times. In still other embodiments, the three-step process is repeated at least 1000 times. In still other embodiments, each of the phases can be repeated as desired. For example, the metal phase 105 may be repeated at least once prior to the reduction phase 109. As another example, the metal phase 105 and reduction phase 109 may be repeated at least once prior to the carbon-contributing phase 113.

Consequently, a uniform metal carbide film or thin film of high purity is formed over the workpiece.

Deposition of Carbon-Containing Films

The foregoing embodiments will be discussed in the context of specific film chemistries.

In one embodiment, a general pulsing sequence for metal carbide thin film deposition is:

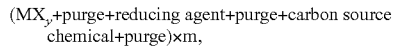
(MX$_y$+purge+reducing agent+purge+carbon source chemical+purge)×m, wherein 'm' is the number of total cycles and 'M' is a metal atom, preferably selected from the group consisting of Ti, Zr, Hf, V, Nb, Ta, Cr, Mo, W, Mn, Re, Fe, Co, Ni, Cu, Ag, Au, Pd, Pt, Rh, Ir, Ru, Os and Al. However, in other embodiments M is selected from the group consisting of Zn, Cd, Ge, Si, Sn, Sb, Ga, and B. The reducing agent is preferably selected from the group consisting of excited species of hydrogen, silicon-containing compounds and boron-containing compounds. Silicon-containing compounds include, without limitation, silane (SiH$_4$), disilane (Si$_2$H$_6$) and trisilane (Si$_3$H$_8$). Boron-containing compounds include, without limitation, borane (BH$_3$) and diborane (B$_2$H$_6$).

'X' is one or more ligands for M and 'y' is an integer greater than or equal to one. Each X is preferably a halogen ligand selected from the group consisting of I, Br, Cl and F. However, in some embodiments at least one X can be an organic ligand, such as a cyclopentadienyl (for example, cyclopentadienyl, methylcyclopentadienyl, pentamethylcyclopentadienyl, ethylcyclopentadienyl, isopropylcyclopentadienyl, tertbutylcyclopentadienyl, and indenyl), alkoxide (for example, methoxide, ethoxide, isopropoxide, and tertbutoxide), alkyl (for example, methyl, ethyl, propyl, and butyl), carbonyl, cyclooctadiene, benzene or hydrogen ligand. In other embodiments, X$_y$ may comprise mixtures of different ligands. However, at least one of the X$_y$ ligands is preferably a halogen. As an example of a metal reactant with mixed ligands, the metal source chemical may be bis(cyclopentadienyl)hafnium dichloride or bis(cyclopentadienyl)tantalum(V) trichloride. The carbon source chemical (or carbon source material) is preferably a hydrocarbon, more preferably a hydrocarbon selected from the group consisting of alkanes, alkenes and alkynes. For example, the carbon source chemical may be acetylene (C$_2$H$_2$). In some embodiments, the carbon source chemical is a carbon-containing compound including boron, such as, e.g., TEB (B(CH$_2$CH$_3$)).

Exemplary ALD pulsing sequences for TaC film formation include:

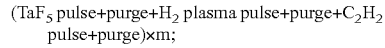
(TaF$_5$ pulse+purge+H$_2$ plasma pulse+purge+C$_2$H$_2$ pulse+purge)×m;

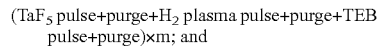
(TaF$_5$ pulse+purge+H$_2$ plasma pulse+purge+TEB pulse+purge)×m; and

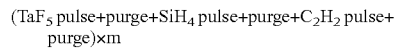
(TaF$_5$ pulse+purge+SiH$_4$ pulse+purge+C$_2$H$_2$ pulse+purge)×m wherein 'm', the total number of cycles, can vary in each case.

In the ALD examples above, substrate or workpiece temperature can be adjusted to enhance formation of the metal carbide films (i.e., thermal ALD).

An exemplary ALD pulsing sequences for tungsten-carbide (WC) thin film formation includes:

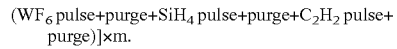
(WF$_6$ pulse+purge+SiH$_4$ pulse+purge+C$_2$H$_2$ pulse+purge)]×m.

An exemplary ALD pulsing sequences for AlC film formation includes:

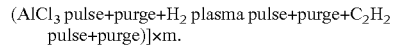
(AlCl$_3$ pulse+purge+H$_2$ plasma pulse+purge+C$_2$H$_2$ pulse+purge)]×m.

EXAMPLE

A tantalum carbide film was deposited on a silicon dioxide (SiO$_2$) substrate in an ALD-type process. The sequence of steps included alternately and sequentially contacting a silicon substrate comprising native oxide with spatially and temporally separated vapor phase pulses of tantalum fluoride (TaF$_5$), hydrogen radicals ("H$_2$*") and a carbon source chemical (TEB or C$_2$H$_2$). The substrate was supported on a susceptor in a PEALD reactor. Deposition was conducted at a susceptor temperature between about 300° C.-350° C. The reactor pressure was about 3 torr. The TaF$_5$ source gas was held at a temperature of about 125° C. Argon (Ar) was introduced into the reactor at a flow rate of approximately 650 sccm and served as a carrier and purge gas. H$_2$* was generated by supplying plasma power (about 100-400 W) to a showerhead disposed over the substrate while flowing hydrogen gas. The showerhead temperature was maintained at about 250° C. The sequence of gas pulses and pulsing times (milliseconds, "ms") were as follows:

(1) TaF$_5$ pulse (900 ms);
(2) Ar purge (3000 ms);
(3) H$_2$* pulse (2000-4000 ms);

(4) Ar purge (2000 ms);
(5) TEB or $C_2H_2$ pulse (1000-2000 ms); and
(6) Ar purge (4000-5000 ms).

Steps (1)-(6) were repeated approximately 800 times.

Metal carbide film growth rates, thicknesses and properties (density, roughness and resistivity) were determined by x-ray reflectometry (XRR) and varied with the carbon source chemical used (TEB or $C_2H_2$). These results are summarized in Table 1.

TABLE 1

Tantalum carbide film properties.

|  | TEB | $C_2H_2$ |
| --- | --- | --- |
| Growth Rate | 0.29 Å/cycle | 0.44 Å/cycle |
| Thickness | 233 Å | 350 Å |
| Density | 12.5 g/cm$^3$ | 13.3 g/cm$^3$ |
| Roughness | 23 Å | 20 Å |
| Resistivity | 349 μΩcm | 203 μΩcm |

The tantalum, carbon and oxygen content of the films did not vary significantly with the carbon source chemical. The distribution of tantalum, carbon and oxygen in the films, as determined by auger electron spectroscopy (AES), was about 50%, 40% and 10%, respectively. The oxygen content may be due to exposure of the film to air following deposition. The oxygen content may also result from oxygen existing in the metal precursor. For example, some types of precursor may oxidize and form metaloxohalides (e.g., $MO_xF_y$). These compounds may have sufficiently high vapor pressure that they can be vaporized and delivered to the substrate.

The films formed according to preferred methods include (111), (200) and (220) crystallographic domains, as determined by X-ray diffraction (XRD) analysis.

Semiconductor Device Applications

Methods of fabricating semiconductor device structures will now be discussed. Although described in terms of several specific contexts, one of skill in the art will recognize that the processes described herein are applicable to many other contexts as well.

Figure 2:
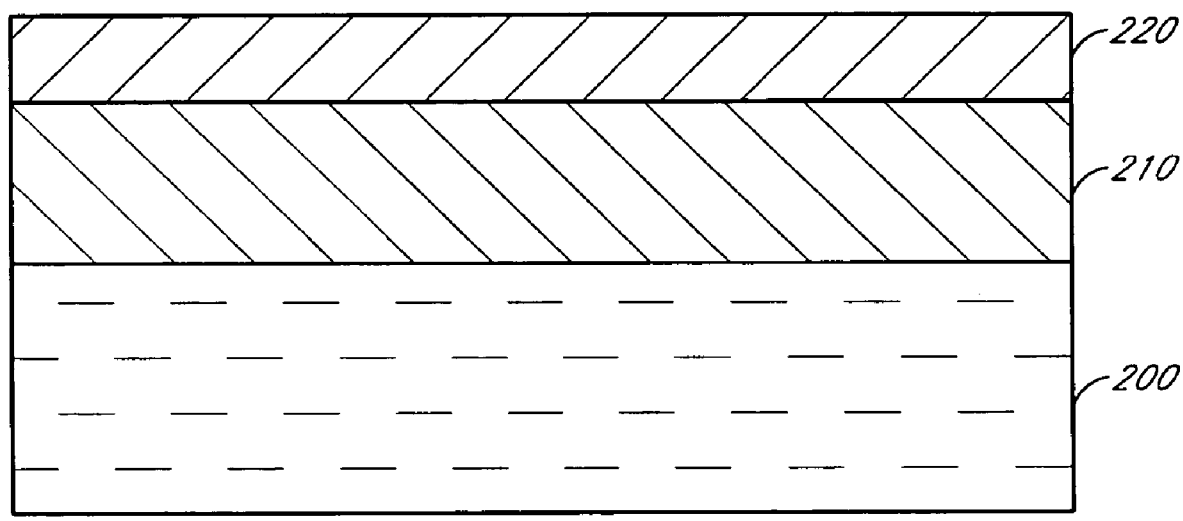
FIG. 2 is a schematic cross-sectional side view of a gate electrode structure, comprising a layer or thin film of a conductive metal carbide.

In some embodiments, the methods of the present invention can be used to form conductive metal carbide electrodes. With reference to FIG. 2, a silicon substrate 200 is illustrated comprising a layer of high-k dielectric material 210. The substrate may be treated prior to deposition of the high-k material. For example, in some embodiments, a thin interfacial layer (not shown) may be deposited prior to deposition of the high-k material. In one embodiment a thin chemical oxide or oxynitride is formed on the surface. In other embodiments a thermal oxide is grown on the substrate.

"High-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, $HfO_2$, $ZrO_2$, $Al_2O_3$, $TiO_2$, $Ta_2O_5$, $Sc_2O_3$, lanthanide oxides and mixtures thereof, silicates and materials such as YSZ (yttria-stabilized zirconia), barium strontium titanate (BST), strontium titanate (ST), strontium bismuth tantalate (SBT) and bismuth tantalate (BT). Preferably, the high-k material is also deposited by an ALD process.

A layer or thin film of conductive metal carbide 220 is deposited over the dielectric (high-k material) layer 210 by an ALD-type process, as described above, to form the illustrated structure. It will be appreciated that in the illustrated embodiment the layers are not necessarily drawn to scale. The metal carbide and underlying high-k material are patterned to form an electrode.

The metal carbide thin film 220 is preferably deposited over the dielectric layer 210 by contacting the substrate with alternating pulses of a metal source chemical, reducing agent and a carbon source chemical, as described above. The metal source chemical is preferably a halide compound (e.g., $TaCl_5$). The reducing agent is preferably selected from the group consisting of excited species of hydrogen and silicon-containing compounds; and the carbon source chemical is preferably a hydrocarbon.

Unreacted source chemicals and reaction byproducts are removed from the reaction chamber after each source chemical pulse by, e.g., evacuation and/or purging with an inert gas (e.g., $N_2$ or Ar). In some embodiments, evacuation is achieved with the aid of a vacuum pump or a plurality of vacuum pumps. The pulsing cycle is repeated until a metal carbide layer of desired thickness is formed. Preferably, the metal carbide layer has a thickness between about 5 Å and 1000 Å. The pulsing cycle may end with a reduction phase or with a pulse of carbon source chemical.

In some embodiments, the conductive metal carbides deposited to form the electrode may comprise one or more metals selected from the group consisting of Ti, Zr, Hf, V, Nb, Ta, Cr, Mo, W, Mn, Re, Fe, Co, Ni, Cu, Ag, Au, Pd, Pt, Rh, Ir, Ru, Os and Al. In other embodiments, the metal carbide may comprise a metal selected from the group consisting of Zn, Cd, Ge, Si, Sn, Sb, Ga, and B. Further non-conductive carbides, such as SiC, can also be deposited.

In some embodiments the metal carbide forms the electrode. In other embodiments (not shown) another conductive material, such as a metal or poly-Si, is deposited over the metal carbide. The additional conductive material may be deposited by ALD or by another deposition process, such as by CVD or PVD. The deposition may be selective or may be followed by patterning steps.

According to still another embodiment, annealing can be performed after metal carbide deposition. Suitable atmospheres, such as $N_2$ or forming gas $N_2/H_2$) and other annealing conditions will be apparent to the skilled artisan.

Further processing steps, such as spacer deposition and source/drain implantation, will be apparent to the skilled artisan.

In other embodiments, metal carbide thin films can be deposited by ALD-type processes (as described above) to form barrier layers for interconnect metallization. The substrate may comprise damascene or dual damascene structures, including high aspect ratio trenches and vias. With reference to FIG. 3, in one embodiment, a dual damascene structure 300 comprises a trench 310, via 320, and dielectric layers 340 and 350 over a substrate 305. In the illustrated embodiment, the layers are not necessarily drawn to scale. The structure 300 is placed in an ALD or PEALD reaction chamber and a metal carbide thin film barrier layer 360 is deposited over the trench 310 and via 320 by contacting the structure 300 with alternating pulses of a metal source chemical, a reducing agent and a carbon source chemical, as described above.

In all of the aforesaid embodiments, any element used in an embodiment can interchangeably be used in another embodiment unless such a replacement is not feasible.

It will be understood by those of skill in the art that numerous and various modifications can be made without departing from the spirit of the present invention. Therefore, it should be clearly understood that the embodiments presented herein are not intended to limit the scope of the present invention. All modifications and changes are intended to fall within the scope of the invention, as defined by the appended claims.

I claim:

1. An atomic layer deposition (ALD) process for growing a metal carbide film over a substrate in a reaction space, comprising alternately and sequentially contacting the substrate with spatially and temporally separated vapor phase pulses of a metal source chemical, a reducing agent and a carbon-containing compound.

2. The process of claim 1, further comprising removing excess metal source chemical, reducing agent or carbon-containing compound after each of said pulses.

3. The process of claim 2, wherein removing comprises purging the reaction space with an inert gas.

4. The process of claim 2, wherein removing comprises evacuating the reaction space using a vacuum generated by a pumping system.

5. The process of claim 1, wherein the reducing agent is a silicon-containing compound selected from the group consisting of silane ($SiH_4$), disilane ($Si_2H_6$) and trisilane ($Si_3H_8$).

6. The process of claim 1, wherein the reducing agent is a boron-containing compound selected from the group consisting of borane ($BH_3$) and diborane ($B_2H_6$).

7. The process of claim 1, wherein the reducing agent comprises excited species of hydrogen ($H_2$).

8. The process of claim 6, wherein the excited species of hydrogen are generated in the reaction space.

9. The process of claim 6, wherein the excited species of hydrogen are generated remotely.

10. The process of claim 1, wherein the metal carbide film comprises one or more metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and aluminum (Al).

11. The process of claim 1, wherein the metal source chemical comprises at least one ligand.

12. The process of claim 11, wherein the ligand comprises organic species selected from the group consisting of dialkylamido compounds, cyclopentadienyl compounds, alkoxide compounds, alkyl compounds, carbonyl, cyclo-octadiene, benzene and hydrogand.

13. The process of claim 11, wherein the ligand comprises a halogen selected from the group consisting of bromine (Br), chlorine (Cl), fluorine (F) and iodine (I).

14. The process of claim 13, wherein the metal source chemical is selected from the group consisting of $TiCl_4$, $ZrCl_4$, $HfCl_4$, $VCl_5$, $NbCl_5$, $TaCl_5$, $TaF_5$, $CrCl_4$, $WCl_5$, $WCl_6$, $WF_6$, and $AlCl_3$.

15. The process of claim 1, wherein the carbon-containing compound is a hydrocarbon.

16. The process of claim 15, wherein the hydrocarbon is selected from the group consisting of alkanes, alkenes and alkynes.

17. The process of claim 16, wherein the hydrocarbon is acetylene ($C_2H_2$).

18. The process of claim 1, wherein the carbon-containing compound comprises boron.

19. The process of claim 18, wherein the carbon-containing compound is triethyl boron ($B(CH_2CH_3)3$).

20. The process of claim 1, wherein the reducing agent is provided at intervals during the ALD process.

21. An atomic layer deposition (ALD) process for growing a metal carbide thin film on a substrate in a reaction space, comprising the sequential steps of:
  a) contacting the substrate with a vapor phase pulse of a metal source chemical;
  b) removing excess metal source chemical from the reaction space;
  c) contacting the substrate with a vapor phase pulse of a reducing agent;
  d) removing excess reducing agent from the reaction space;
  e) contacting the substrate with a vapor phase pulse of a carbon-containing compound; and
  f) removing any excess carbon-containing compound from the reaction space.

22. The process of claim 21, further comprising repeating steps a) through f) until a metal carbide film of predetermined thickness is formed over the substrate.

23. The process of claim 21, wherein steps a) through d) are repeated a predetermined number of times before steps e) and f).

24. The process of claim 21, wherein the metal carbide film comprises one or more metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and aluminum (Al).

25. The process of claim 21, wherein the metal source chemical is selected from the group consisting of metal halides and metal organic compounds.

26. The process of claim 25, wherein the metal source chemical is selected from the group consisting of $TiCl_4$, $ZrCl_4$, $HfCl_4$, $VCl_5$, $NbCl_5$, $TaCl_5$, $TaF_5$, $CrCl_4$, $WCl_5$, $WCl_6$, $WF_6$, and $AlCl_3$.

27. The process of claim 25, wherein metal organic compounds are selected from the group consisting of metal dialkylamido compounds and metal cyclopentadienyl compounds.

28. The process of claim 21, further comprising removing any reaction byproducts from the reaction space after each of said pulses.

29. The process of claim 21, wherein contacting comprises feeding said pulses with a carrier gas.

30. The process of claim 21, wherein the reducing agent comprises one or more silicon-containing compounds selected from the group consisting of silane ($SiH_4$), disilane ($Si_2H_6$) and trisilane ($Si_3H_8$).

31. The process of claim 21, wherein the reducing agent comprises one or more boron-containing compounds selected from the group consisting of borane ($BH_3$) and diborane ($B_2H_6$).

32. The process of claim 21, wherein the reducing agent comprises excited species of hydrogen ($H_2$).

33. The process of claim 21, wherein the carbon-containing compound is a hydrocarbon.

34. The process of claim 33, wherein the hydrocarbon is selected from the group consisting of alkanes, alkenes and alkynes.

35. The process of claim 21, wherein the carbon-containing compound comprises boron.

36. The process of claim 35, wherein the carbon-containing compound is triethyl boron ($B(CH_2CH_3)3$).

37. An atomic layer deposition (ALD) process for growing a metal carbide thin film on a substrate in a reaction space, comprising the sequential steps of:

a) contacting the substrate with a vapor phase pulse of a metal source chemical;

b) contacting the substrate with a vapor phase pulse of a reducing agent; and c) contacting the substrate with a vapor phase pulse of a carbon-containing compound.

38. The process of claim 37, further comprising repeating steps a) through c) until a metal carbide film of predetermined thickness is formed over the substrate.

39. The process of claim 37, further comprising removing excess reactants and reaction by-products after each of the vapor phase pulses.

40. The process of claim 37, wherein steps a) and b) are repeated a predetermined number of times before step c).

41. The process of claim 37, wherein the metal carbide film comprises one or more metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and aluminum (Al).

42. The process of claim 37, wherein the metal source chemical is selected from the group consisting of metal halides and metal organic compounds.

43. The process of claim 42, wherein the metal source chemical is selected from the group consisting of $TiCl_4$, $ZrCl_4$, $HfCl_4$, $VCl_5$, $NbCl_5$, $TaCl_5$, $TaF_5$, $CrCl_4$, $WCl_5$, $WCl_6$, $WF_6$, and $AlCl_3$.

44. The process of claim 42, wherein metal organic compounds are selected from the group consisting of metal dialkylamido compounds and metal cyclopentadienyl compounds.

45. The process of claim 37, further comprising removing any reaction byproducts from the reaction space after each of said pulses.

46. The process of claim 37, wherein contacting comprises feeding said pulses with a carrier gas.

47. The process of claim 37, wherein the reducing agent comprises silicon-containing compounds selected from the group consisting of silane ($SiH_4$), disilane ($Si_2H_6$) and trisilane ($Si_3H_8$).

48. The process of claim 37, wherein the reducing agent comprises boron-containing compounds selected from the group consisting of borane ($BH_3$) and diborane ($B_2H_6$).

49. The process of claim 37, wherein the reducing agent comprises excited species of hydrogen ($H_2$).

50. The process of claim 37, wherein the carbon-containing compound is a hydrocarbon.

51. The process of claim 50, wherein the hydrocarbon is selected from the group consisting of alkanes, alkenes and alkynes.

52. The process of claim 37, wherein the carbon-containing compound comprises boron.

53. The process of claim 52, wherein the carbon-containing compound is triethyl boron ($B(CH_2CH_3)3$).

54. A plasma-enhanced atomic layer deposition (PEALD) process for growing a metal carbide thin film on a substrate, comprising alternately and sequentially contacting a substrate in a reaction space with temporally and spatially separated vapor phase pulses of:

a metal source material that forms no more than about one monolayer of a metal thin film on an exposed surface of the substrate;

excited species of hydrogen ($H_2$) that reduce the metal thin film to an elemental metal thin film; and a carbon source material that forms no more than about one monolayer of a metal carbide thin film, wherein any excess metal source material, excited species of hydrogen and carbon source material are removed from the reaction space after each of said pulses.

55. The process of claim 54, wherein the metal carbide thin film comprises one or more metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os) and aluminum (Al).

56. The process of claim 54, wherein the metal source material is selected from the group consisting of metal halides and metal organic compounds.

57. The process of claim 56, wherein the metal source material is selected from the group consisting of $TiCl_4$, $ZrCl_4$, $HfCl_4$, $VCl_5$, $NbCl_5$, $TaCl_5$, $TaF_5$, $CrCl_4$, $WCl_5$, $WCl_6$, $WF_6$, and $AlCl_3$.

58. The process of claim 54, wherein the metal organic compounds are selected from the group consisting of metal dialkylamido compounds and metal cyclopentadienyl compounds.

59. The process of claim 54, further comprising removing any reaction byproducts from the reaction space after each of said pulses.

60. The process of claim 54, wherein the carbon source material is a hydrocarbon.

61. The process of claim 60, wherein the hydrocarbon is selected from the group consisting of alkanes, alkenes and alkynes.

62. The process of claim 54, wherein the carbon source material comprises boron.

63. The process of claim 62, wherein the carbon source material is triethyl boron ($B(CH_2CH_3)3$).

64. The process of claim 54, wherein the excited species of hydrogen are generated in the reaction space.

65. The process of claim 54, wherein the excited species of hydrogen are generated in a remote plasma generator.

* * * * *

UNITED STATES PATENT AND TRADEMARK OFFICE
CERTIFICATE OF CORRECTION

PATENT NO. : 7,611,751 B2  Page 1 of 1
APPLICATION NO. : 11/591845
DATED : November 3, 2009
INVENTOR(S) : Elers It is certified that error appears in the above-identified patent and that said Letters Patent is hereby corrected as shown below:

At column 10, line 19, please remove "$(B(CH_2CH_3))$." and insert therefore, --$(B(CH_2CH_3)_3)$.--.

At column 10, approximately line 28, please remove "purge)×m" and insert therefore, --purge)×m,--.

At column 10, line 39, please remove "AIC" and insert therefore, --AlC--.

At column 12, line 40, please remove "$N_2/H_2$)" and insert therefore, --$(N_2/H_2)$--.

At column 13, line 65, in Claim 19, please remove "$(B(CH_2CH_3)3)$." and insert therefore, --$(B(CH_2CH_3)_3)$.--.

At column 14, line 64, in Claim 36, please remove "$(B(CH_2CH_3)3)$." and insert therefore, --$(B(CH_2CH_3)_3)$.--.

At column 16, line 2, in Claim 53, please remove "$(B(CH_2CH_3)3)$." and insert therefore, --$(B(CH_2CH_3)_3)$.--.

At column 16, line 32, in Claim 57, please remove "$NbCI_5$," and insert therefore, --$NbCl_5$,--.

At column 16, line 49, in Claim 63, please remove "$(B(CH_2CH_3)3)$." and insert therefore, --$(B(CH_2CH_3)_3)$.--.

Signed and Sealed this

Twentieth Day of April, 2010

David J. Kappos
*Director of the United States Patent and Trademark Office*

UNITED STATES PATENT AND TRADEMARK OFFICE
CERTIFICATE OF CORRECTION

PATENT NO. : 7,611,751 B2
APPLICATION NO. : 11/591845
DATED : November 3, 2009
INVENTOR(S) : Kai-Erik Elers It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 160 days.

Signed and Sealed this

Twelfth Day of October, 2010

David J. Kappos
*Director of the United States Patent and Trademark Office*